(12) United States Patent
Emerich

(10) Patent No.: US 10,788,543 B2
(45) Date of Patent: Sep. 29, 2020

(54) IN SITU PRESSURE BALANCED OIL-FILLED CABLE CONNECTOR INTEGRITY MONITORING

(71) Applicant: Hydril USA Distribution LLC, Houston, TX (US)

(72) Inventor: Francis Emerich, Houston, TX (US)

(73) Assignee: Hydril USA Distribution LLC, Houston, TX (US)

( * ) Notice: Subject to any disclaimer, the term of this patent is extended or adjusted under 35 U.S.C. 154(b) by 128 days.

(21) Appl. No.: 15/981,543

(22) Filed: May 16, 2018

(65) Prior Publication Data

US 2018/0340970 A1 Nov. 29, 2018

Related U.S. Application Data

(60) Provisional application No. 62/511,650, filed on May 26, 2017.

(51) Int. Cl.
*G01R 31/04* (2006.01)
*H01R 13/52* (2006.01)
(Continued)

(52) U.S. Cl.
CPC .......... *G01R 31/69* (2020.01); *E21B 33/0355* (2013.01); *E21B 33/0385* (2013.01);
(Continued)

(58) Field of Classification Search
None
See application file for complete search history.

(56) References Cited

U.S. PATENT DOCUMENTS

| 6,725,924 B2 | 4/2004 | Davidson et al. |
| 8,353,350 B2 | 1/2013 | Overfield |

(Continued)

FOREIGN PATENT DOCUMENTS

| WO | 2016/100663 A1 | 6/2016 |
| WO | 2017071844 | 5/2017 |

OTHER PUBLICATIONS

International Search Report and Written Opinion issued in connection with corresponding PCT Application No. PCT/US2018/034595 dated Sep. 4, 2018.

(Continued)

*Primary Examiner* — Jermele M Hollington
*Assistant Examiner* — Suresh K Rajaputra
(74) *Attorney, Agent, or Firm* — Hogan Lovells US LLP

(57) ABSTRACT

The disclosure is related to a system and method for monitoring the integrity of fluid filled connector systems. The system includes a connector with a first space and a first measurement probe. A module or a receptacle is connected to the connector and includes first wiring that is coupled with second wiring in the connector. The module or the receptacle includes a second space in fluid connection with the first space. The first space and the second space include a fluid sealed within. The second space includes a second measurement probe. A measurement device is connected to the first measurement probe and the second measurement probe to determine an impedance value across the first space and the second space. The impedance value corresponds to an integrity measure for the system based at least in part on the fluid sealed within.

20 Claims, 6 Drawing Sheets

(51) Int. Cl.
*G01M 3/16* (2006.01)
*E21B 33/06* (2006.01)
*E21B 47/00* (2012.01)
*G01R 31/69* (2020.01)
*H01R 13/66* (2006.01)
*E21B 33/038* (2006.01)
*E21B 47/001* (2012.01)
*E21B 33/035* (2006.01)
*E21B 33/064* (2006.01)
*H01R 13/533* (2006.01)
*G01R 27/22* (2006.01)
*H01R 13/523* (2006.01)

(52) U.S. Cl.
CPC .......... *E21B 33/063* (2013.01); *E21B 33/064* (2013.01); *E21B 47/001* (2020.05); *G01M 3/16* (2013.01); *H01R 13/5221* (2013.01); *H01R 13/6683* (2013.01); *G01R 27/22* (2013.01); *H01R 13/523* (2013.01); *H01R 13/533* (2013.01)

(56) References Cited

U.S. PATENT DOCUMENTS

| | | |
|---|---|---|
| 8,575,945 B2 | 11/2013 | Douglas |
| 2006/0037758 A1 | 2/2006 | Reynolds |
| 2009/0194290 A1 | 8/2009 | Parks et al. |
| 2016/0131692 A1* | 5/2016 | Jaffrey ............... G01R 31/1272 324/544 |
| 2017/0175476 A1 | 6/2017 | Painter et al. |
| 2018/0076573 A1* | 3/2018 | Walton ................ E21B 33/0385 |

OTHER PUBLICATIONS

K. Soma et al., "Diagnostic Method for Power Cable Insulation," Dec. 1986, IEEE Transactions on Electrical Insulation, vol. EI-21, No. 6, pp. 1027-1032.

* cited by examiner

IN SITU PRESSURE BALANCED OIL-FILLED CABLE CONNECTOR INTEGRITY MONITORING

CROSS-REFERENCE AND RELATED APPLICATION

This application claims the benefit of priority to U.S. Provisional Application No. 62/511,650 filed on May 26, 2017, the disclosure of which is incorporated by reference in its entirety herein.

BACKGROUND

Pressure balanced oil-filled (PBOF) cables are used in subsea oil and gas operations to interconnect electrical and communication systems and equipment. PBOF cables rely on robust insulation provided by oil housed within the casing of the PBOF cables. Systems rely on connecting a test device to a plug, pins, or contacts within the connector. Such systems require disconnecting the connector from its intended use connection for testing integrity of the connector.

BRIEF DESCRIPTION OF THE DRAWINGS

Various embodiments in accordance with the present disclosure will be described with reference to the drawings, in which.

DETAILED DESCRIPTION

Figure 1:
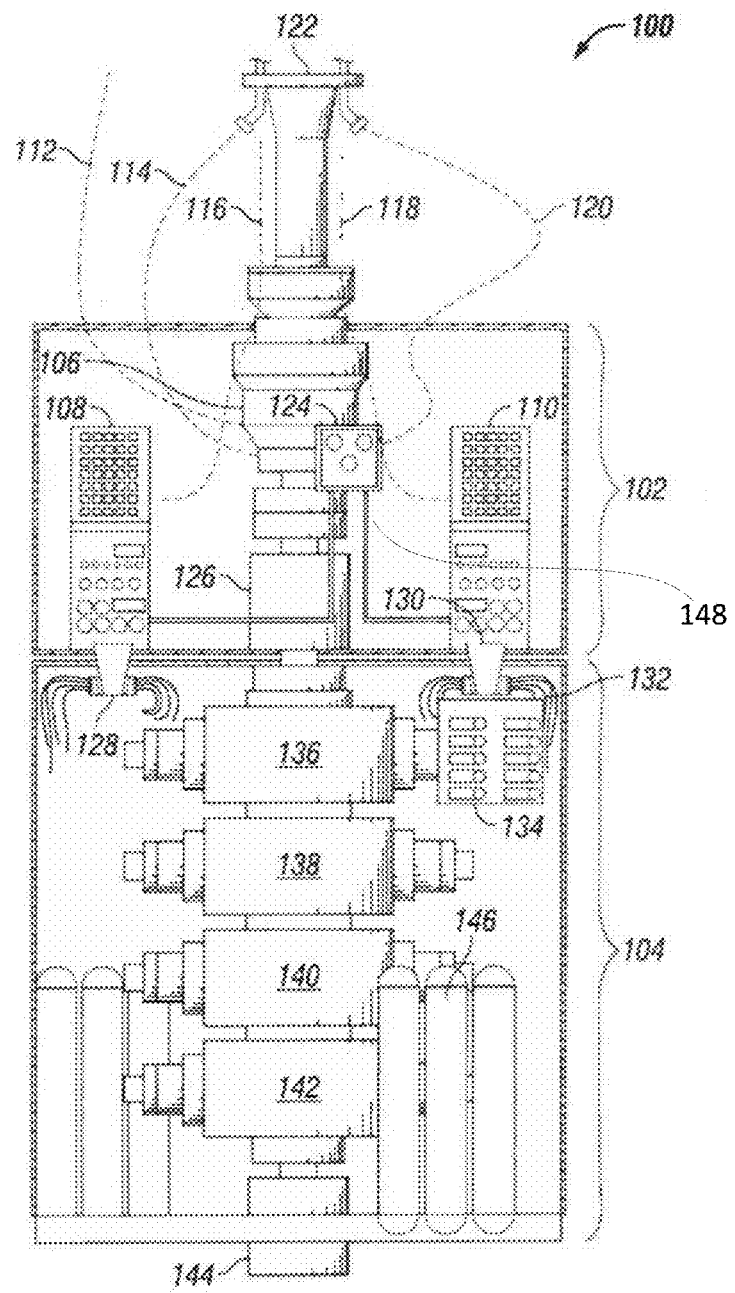
FIG. 1 illustrates a cross sectional front view of a stack with access space and an access port in accordance with various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Systems and methods in accordance with various embodiments of the present disclosure may overcome one or more of the aforementioned and other deficiencies experienced in conventional approaches to integrity testing or checking for connectors, including those used to connect PBOF cables. In an example, the disclosure herein is to a system and method for testing and for real-time integrity monitoring of fluid-filled connectors, such as pressure balanced oil-filled (PBOF) cable connectors without disconnecting the cables. The PBOF connectors are filled with oil which has a specific gravity (SG) that is approximately that of water or within a predetermined percentage of seawater's SG. As used herein, fluid refers to gas or denser material, such as oil and water. In an example, the fluid is one of: (a) an oil with an SG that is up to 5% or up to 10% different than fresh or salt water's specific gravity at a predetermined temperature; (b) air; or (c) a combination of the oil and the air. With the filling of oil at an SG near seawater, the pressure within the sealed connector is balanced with that of the surrounding seawater in subsea applications. Alternatively, the pressure after sealing of the connector may be 1 standard atmosphere measured from when the connectors are coupled at sea surface level before being submerged to the subsea environment. This 1 standard atmosphere pressure is maintained in the subsea environment during regular operation. Further, a slight variation to the 1 standard atmosphere pressure may occur (e.g., up to ±1% variation). As a result, during subsea operations, because of the balanced pressure, ingression of seawater into the connector is limited. The integrity of the connecter (and the system), however, is monitored, because ingression that occurs may be on-going and cause other issues if continued. As such, the integrity of the system is based at least in part on the fluid sealed within. For example, a change to the fluid may occur or a change to its properties may occur. Such changes may be because of ingress of seawater, for example. The property of the fluid may change (because of mixing of the seawater) to electrically conduct charge. This change affects an impedance measure (at least a resistance) across two probes in different locations of the system.

In an example, a system disclosed herein includes a connector with a first space and one or more inner seals that seal a fluid in the first space when the connector is connected to a receptacle or a module. The first space allows for a first measurement probe. The module or the receptacle includes first wiring that is coupled (e.g., electrically and/or communicatively) with second wiring in the connector. The module or the receptacle includes a second space remote from the first space but that may be in fluid connection with the first space. The second space allows for a second measurement probe. A measurement device is connected to a first measurement probe and the second measurement probe to determine an impedance value across the first space and the second space. In an example, the resistance value may be limited to a resistance value component of impedance, such that the resistance value corresponds to an integrity measure of the connector. Where impedance is used, alternating current (AC) is used for testing, and the impedance value corresponds to the integrity measure of the connector. Other component of the impedance values, such as an angle indicating capacitance or inductance may be useful in determining leakage or comprise of the integrity of the connector. Furthermore, the resistance or impedance value may be taken as an integrity measure of the connection between the connector and the module or the receptacle. The system is, therefore, an in situ connector integrity monitoring and testing system. Unless stated otherwise, connector is generally used to refer to one or more of individual side connectors (e.g., male-side plug, female-side receptacle), or an electrical or mechanical coupling of two side connectors, unless otherwise specified.

In another example, a method disclosed herein includes a step for providing a first space of a connector using one or more inner seals to seal a fluid in the connector when the connector is connected to a receptacle or a module. The first space allows for a first measurement probe. The method includes connecting the connector to a module or a receptacle having a second space in fluid connection to the first space. The module or the receptacle includes first wiring that is coupled (e.g., electrically and/or communicatively) with second wiring in the connector. As such the connection between the connector and the module or the receptacle is electrical and mechanical—e.g., electronic plugging followed by a threaded action to mechanically seal the connection. The second space of the module or the receptacle allows for a second measurement probe. The second space is remotely located from the first space. The method further includes determining an impedance value, such as a resistance, measured across the first space and a second space using a measurement device. The measurement device is connected to the first measurement probe and to the second measurement probe. The resistance corresponds to an integrity measure for the connector, the connection, or the system as a whole. Further, the resistance may be based at least in part on the fluid sealed within the first space and the second space. From this example method, the resistance value may be taken as an integrity measure of the connection between the connector and the module or the receptacle. The method is, therefore, an in situ connector integrity monitoring method for a system configured to receive such method steps.

The example system and method of the present disclosure includes the external access ports to function as electrical test ports which allows the measurement of cable/connector insulation resistance using measurement probes. Such access ports are provided across the connection—e.g., at the connector and at a receptacle or module connected to the connecter. For example, the system may be removed from subsea level to surface level and the access ports may then be accessed. A measurement device or metering device connected between the measurement probes, to a combination of two or more test ports provides or applies a voltage across the insulation boundaries of PBOF. For example, the access ports provide access to the measurement probes to spaces within the system. A space may refer to a flat area, a connection point, or a cavity. Readings of resistance for the provided or applied voltage are obtained. When no fluid is present in the spaces, which may be indicative of no fluid in the connection, the resulting resistance will be higher than when fluid, such as water (of any kind) is present in the spaces, and therefore, the connection. In addition, the example system and method herein allows for real time monitoring of the cable integrity and failures without decoupling the connection while in subsea operation. Such a process may rely on branching wires from the cables in the connector. The branching wires may be provided to access the spaces without the need for the ports to be opened. Such a discussion is provided with respect to at least FIGS. 5 and 6. Further, data collected by the measuring device or metering device can be transmitted to a remote location for integrity assessment. Changes in resistance between two spaces (e.g., depending on the fluid content in the spaces—including presence or absence of the fluid, and/or the quantity of fluid) may be used as indication of ingress of water into the cable or the connection.

Various other functions can be implemented within the various embodiments as well as discussed and suggested elsewhere herein.

FIG. 1, a representative system overview of a BOP stack is shown. In FIG. 1, a BOP stack 100 is pictured, which includes a lower marine riser package (LMRP) 102 and a lower stack (LS) 104. LMRP 102 includes an annular 106, a blue control pod 108, and a yellow control pod 110. A hotline 112, a blue conduit or cables 114, and a yellow conduit or cables 120 proceed downwardly from a riser 122 into LMRP 102 and through a conduit manifold 124 to control pods 108, 110. A blue power and communications line 116 and a yellow power and communications line 118 proceed to control pods 108, 110, respectively. An LMRP connector 126 connects LMRP 102 to LS 104. Hydraulically activated wedges 128 and 130 are disposed to suspend connectable hoses or pipes 132, which can be connected to shuttle panels, such as shuttle panel 134.

LS 104 can include shuttle panel 134, as well as a blind shear ram BOP 136, a casing shear ram BOP 138, a first pipe ram 140, and a second pipe ram 142. BOP stack 100 is disposed above a wellhead connection 144. LS 104 can further include optional stack-mounted accumulators 146 containing a necessary amount of hydraulic fluid to operate certain functions within BOP stack 100. Control pods 108, 110 may include power and communications facilities for providing power and communications to various components in the LMRP and the LS, including the conduit manifold, subsea electronics module (SEM), solenoids, pod instrumentation, electrical units, instrumentation elements, and monitoring elements. Power and communications for the modules, units, and elements of the BOP stack 100 may be transmitted via cables, e.g., cable 148, and may further include, CAT5E connector cables and standard PBOF cables carrying appropriate power supplies, including 24 Volts direct current (DC), 110 Volts DC, and 480 volt alternating current (VAC) 60 Hz, which may be converted to the 24 volt DC supply.

Figure 2:
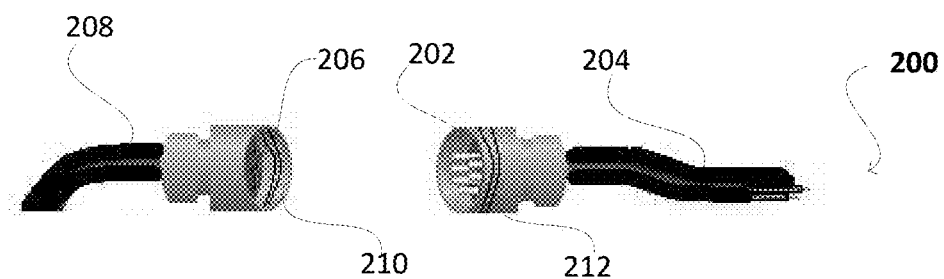
FIG. 2 illustrates a general example of a connector, such as a pressure balanced oil filled (PBOF) connector, for power and communications and includes oil, air, or another applicable fluid as discussed in accordance with various embodiments.

FIG. 2 illustrates an example connector 200 including male pins 202 on a male-side plug of the connector and female slots 206 on a female-side receptacle of the connector. The connector 200 may be a pressure balanced oil filled (PBOF) connector. The connector 200 may include fluid through a space within the connectors. Such fluid, in the case of a PBOF connector may be a specific type of oil, or maybe air or another fluid as suitable for the specific application. In one application, the fluid may be of a type having similar specific gravity as seawater. The example connector 200 may be applicable for one or more of the above-described power or communication connections. FIG. 2 also illustrates internal threads 210 and external treads 212 for connecting the connector sides after the plug mates with the receptacle, and that ensures a pressure sealing for the fluid within the connector 200. Alternatively, other matting systems for pins or electrical coupling, along with other threaded/threadless joinders or mechanical coupling are respectively applicable to provide the electrical mating and to provide the mechanical pressure sealing of the connector. Cables 204, 208 from the connector are provided to the respective units, elements, or components desiring power or communications.

Figure 3:
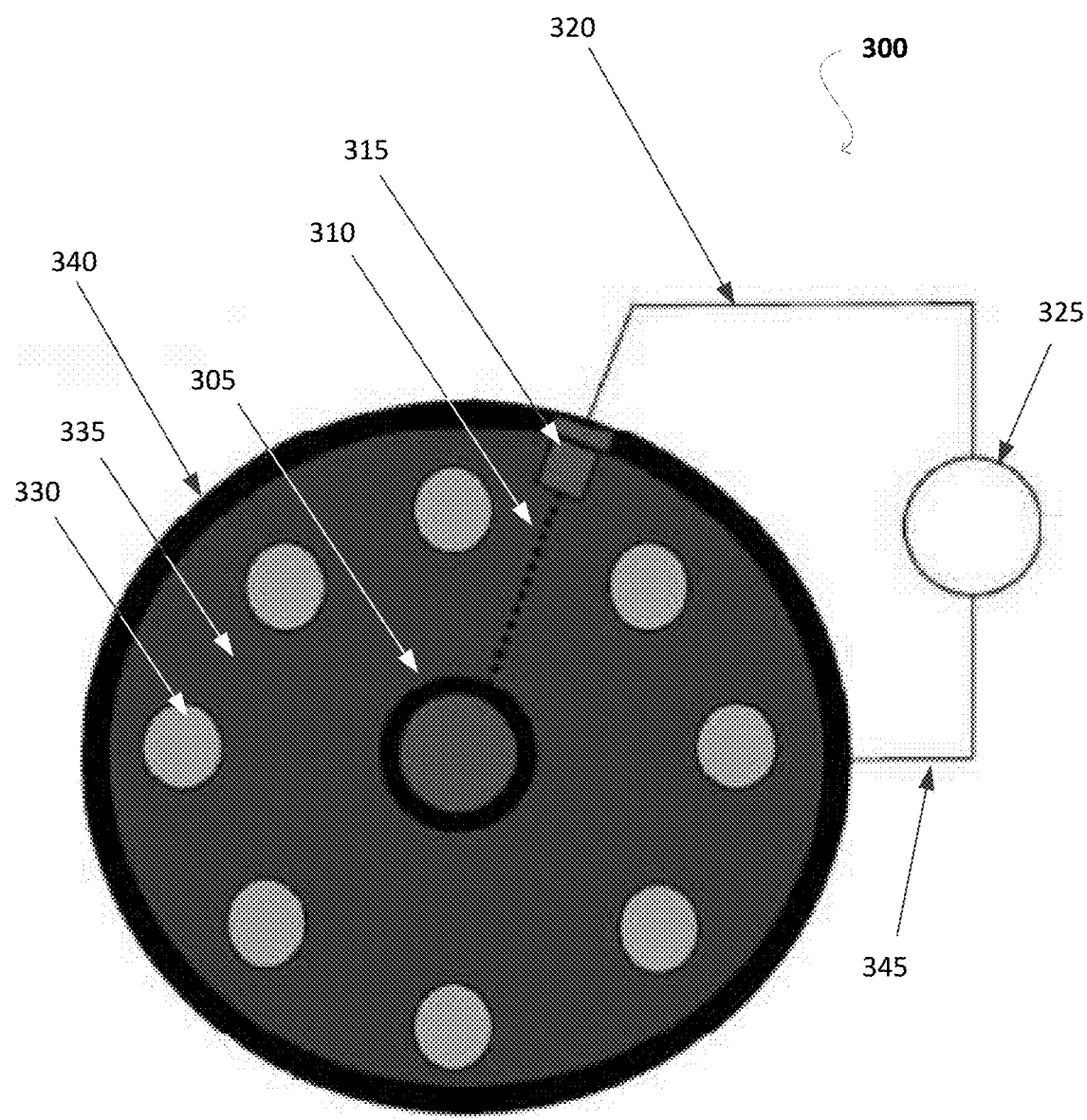
FIG. 3 illustrates a cross sectional front view of a connector with access space and an access port in accordance with various embodiments.

FIG. 3 illustrates a cross sectional front view of a connector 300 with access space and an access port in accordance with various embodiment. Connector 300 may be applicable in a system and a method of the presently disclosed in situ PBOF cable connector integrity monitoring.

The system can monitor the insulation integrity of PBOF connectors and of a system while the PBOF connectors remain coupled or in an operative environment, such as a subsea environment and/or connected to other components. For example, connector 300 may be connected to a receptacle or a module via contacts, plugs, or pins 330. In one aspect, connector 300 includes one or more access ports or electrical test ports 315 for external access that allow measurement of cable/connector insulation resistance without disconnection of the assembly. FIG. 3 illustrates one access port 315 for simplicity of this disclosure. The BOP stack may be retrieved from subsea for access the ports in the connectors without removing the connections. Alternatively, at subsea, internal branching of the wires (using for power and communication) may provide fixed access to the first space and the second space without a need to open the ports. As there are multiple such connectors throughout the BOP Stack, the present system and method improves efficiency of testing systems prior to deployment or at intermittent stages through the life of the BOP stack.

Figure 5:
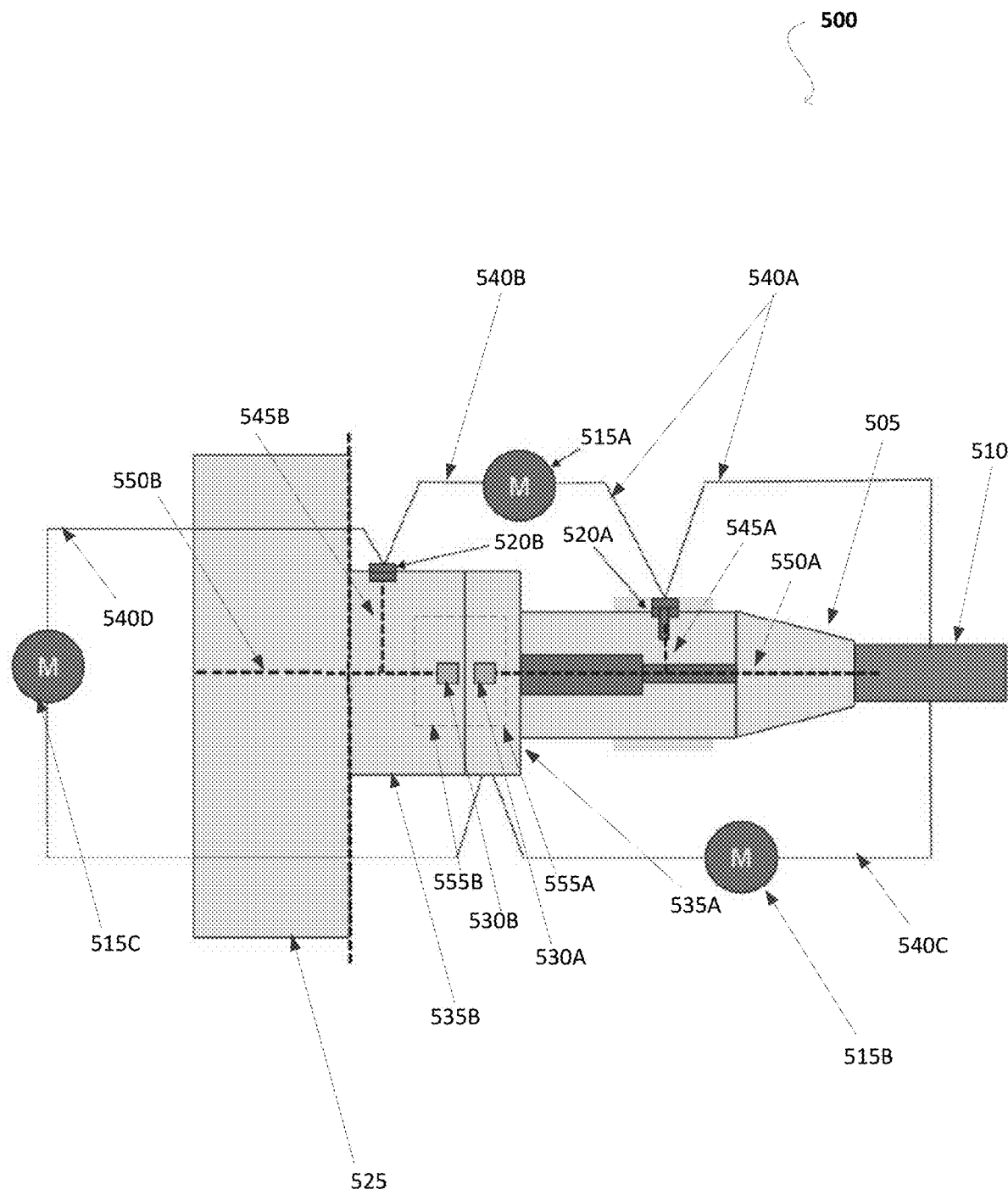
FIG. 5 illustrates a system with a connector of the present disclosure in a connection with a receptacle and/or a module which provide an example system for performing the disclosed embodiments in accordance with an aspect of this disclosure.

A system utilizing connector 300 would have access ports remote from the connector 100. Alternatively, multiple connectors of similar type as connector 300 may be provided in male and female contact configurations and the measurement would be across two of such connectors via their respective access ports. The access ports (e.g., access port 315) provide access to one or more spaces within the connector. For example, a measurement probe 320 terminates inside the connector at a metal disk or other receiving probe end 305. The probe end 305 is open to the connector space once the connector mates with a receptacle or a module. In an aspect of the disclosure, the space (and the access ports) is sealed using one or more inner seals, such as one among an o-ring, a nut, and a washer. In another aspect, the connectors do not have access ports, but are internally configured for measurement of cable/connector insulation resistance via a portion of the cabling within a cable acting as the measurement probes 320 as illustrated in FIG. 5 (e.g., reference numeral 545A for wiring branching from wiring 550A and reference numeral 545B for wiring branching from wiring 550B) and its supporting discussion. Such a structure advantageously provides a method to identify cable/connector failures or degradation without decoupling devices.

Connector 300 may include a socket or insulator separation 335, sheath 340 of any material recognizable to person of skill in the art as capable of maintaining internal components without damage in subsea environments, and an inner channel 310 for guiding the measurement probe 320. The measurement probe 320 is connected to a measurement device 325, with a second measurement probe 345 connected to another end of the measure device 325. This second measurement probe 345 accesses a different space that is remote from space accessed by probe end 305. In an application, the different space may be on the connecter at a different location, on another connector, or in another part of the system to measure integrity across the two spaces and in the system.

Figure 4:
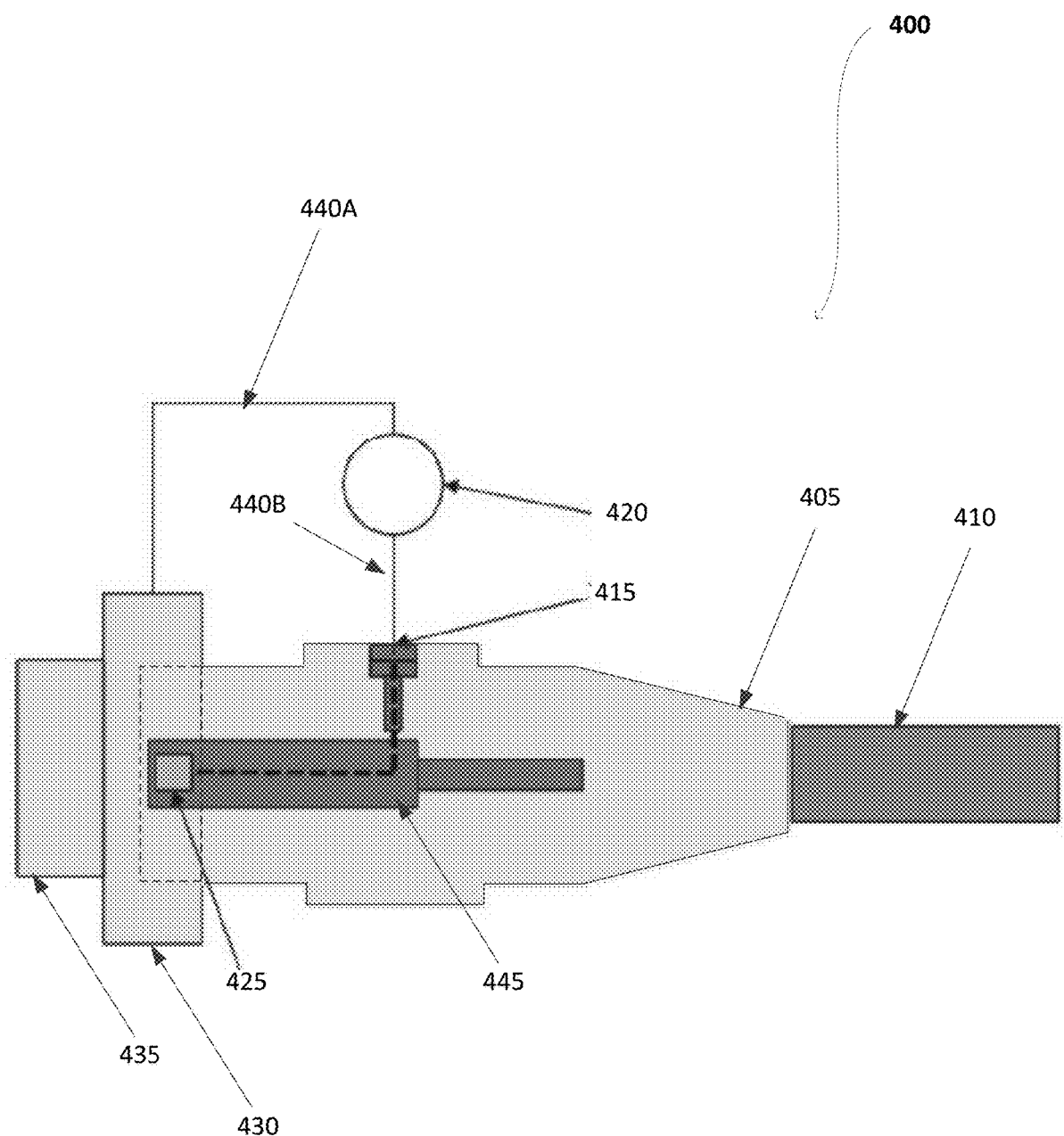
FIG. 4 illustrates a cross sectional side view of a connector with access space and an access port in accordance with various embodiments.

FIG. 4 illustrates a cross sectional side view of a connector in a system 400 with access space and an access port in accordance with various embodiments. Connecter 405 in system 400 may be similar to connecter 300 of FIG. 3. In such an implementation, FIGS. 3 and 4 may depict a front or end cross-sectional view, and a side cross-sectional view, respectively, of a connector 300/405. The connector 405 may include a threaded insert, short pin, or conductive disk with a wire embedded in the connector insert 425, functioning as a probe end, for providing measurements via a measurement probe accessing the electrical test port or access port 415. The connector insert 425 forms part of connector chassis 445 that hosts the pins, contacts, or plugs (similar to reference numeral 330 of FIG. 3). The threaded insert, short pin, or wire may also be configured as one of pins 330 of FIG. 3. Further, in a different aspect or along with the use of the access port 415, the threaded insert, short pin, or wire may fed from a portion of the wiring from cable 410. As such, in an example, the wire feeding pins 330 (FIG. 3) may come from cable 410 and a portion of the wires in cable 410 may be allocated for testing. The connector 405 includes coupling 430 for connecting the connector 405 to another connector or to a receptacle or module. Guide 435 provides physical guidance and sealing for the mating between the pins, plugs, or connects of connector insert 425, from connector 405, to the other connector, receptacle or module.

In an alternate aspect, components 405, 430, and 435, along with their internal components (e.g., pins, insulator separation, seals, access ports, connector inserts, etc.) are collectively referred to as the connector and are collectively provided in a manufactured form for assemble with cable 410. Measuring or metering device 420 is provided in a detachable manner to probes 440A and 440B for the access port 415 and the connector insert 425. The measuring or metering device 420 and the use of access ports 415 may be substituted for with internal feedback send via cable 410 as part of the cables wiring, using a portion of the wiring. In either case, the connector 405 does not have to be disconnected to access its front face via guide 435.

FIG. 5 illustrates a system 500 with a connector 505 of the present disclosure in a connection with a receptacle and/or a module which provide an example system for performing the disclosed embodiments in accordance with an aspect of this disclosure. In an example, the receptacle and/or the module may be another connector to receive connector 505. For example, as illustrated in FIG. 2, the connector 505 may be a male connector and the receptacle and/or the module may be a female receptacle that may also be referred to a connector (i.e., with more specificity, a female connector). In FIG. 5, the connector 505, which may be similar to connectors 300/405 in FIGS. 3 and 4, is physically coupled to a receptacle 535B using coupling 535A. Electrically or communicatively, a configuration of pins with a second disk (probe end) in connector insert 530B is embedded in the insulator separation of an opposing connection member in the receptacle 535B. This configuration of pins with the second disk in connector insert 530B provides electrical or communicative coupling or connection to a corresponding configuration of pins with a first disk (probe end) in connector insert 535B. However, even though the configuration of pins are fully contacted to ensure a good connection, there is a separation between the first and second disks of connector inserts 530A and 530B to ensure that measurement of fluid in spaces 555A, 555B is not disrupted by shorting, for example. Further, the measurement probes, e.g., measurement probe 540B, may be connected to a counterpart measurement probe with a connective end in the access port, e.g., access port 520B. The counterpart measurement probe is detachably or fixedly connected to the disk (probe end) in the connector insert 530B. For this disclosure, the measurement probe 540B and its counterpart measurement probe in the access port are together referred to as the measurement probe. As a result, the access port seals are not compromised by the connection of the measuring and metering device.

In an example, receptacle 535B is a flange connector receptacle (FCR). The FCR may further be connected to a module, such as a subsea electronics module (SEM) 525. FIG. 5 additionally demonstrates various modes or configurations of connections to measure integrity from different locations in system 500. In one example, a measuring or metering device 515A is provided for measurement probes 540B and its corresponding counterpart in access port 520A. As a result, the measurement from the measuring or metering device 515A provides resistance values of fluid encountered in spaces 555A, 555B at these two locations and therefore provides integrity measures between connector 505 and receptacle 535B. In one aspect, no measuring or metering device is provided externally, but monitoring is provided via the measurement probe 540A, from the access port 520A, feeding back into a portion of the wires in cable 510. In another example, a measuring or metering device 515B is provided for measurement probes 540C between a coupler comprising the connector insert 530A and its corresponding counterpart measurement probe that accesses the cable 510. As a result, the measurement from the measuring or metering device 515B provides resistance values of fluid encountered in spaces 555A, 555B at these two locations and therefore provides integrity measures between connector 505 and cable 510. Connection points directly to a surface in the illustrations of FIGS. 1-4 are provided to demonstrate possible access ports for the measurement probes. However, the access ports are not always illustrated as a person of ordinary skill would understand from this disclosure as to their availability and functionality.

The resistance value corresponds to integrity measure of the connector. In an example, a predetermined correlation chart may be provided to indicate integrity based on a received resistance value. Furthermore, a similar correlation is provided for the resistance value that may be applied to an integrity measure of the connection between the connector and the module or the receptacle. The predetermined correlation chart may be based on calibration of the system prior to application in the subsea operations. In an example, the calibration is performed in a test pool of seawater with the connectors connected to test equipment replicating the subsea environment with differences as to the depth or pressure in the actual subsea environment. The calibration may also account for different types of fluid filling in the spaces 555A, 555B or different position or levels of fluid filling (including in the absence of fluid).

In another example, a measuring or metering device 515C is provided for measurement probes 540D between the coupler comprising the connector insert 530A and its corresponding counterpart measurement probe that accesses the access port 520B. As a result, the measurement from the measuring or metering device 515C provides resistance values of fluid encountered in spaces 555A, 555B at these two locations and therefore provides integrity measures between connector 505 and receptacle 535B. In some aspects, the measuring or metering devices 515A-C may be low voltage devices, to help avoid damage to the connected equipment.

Figure 6:
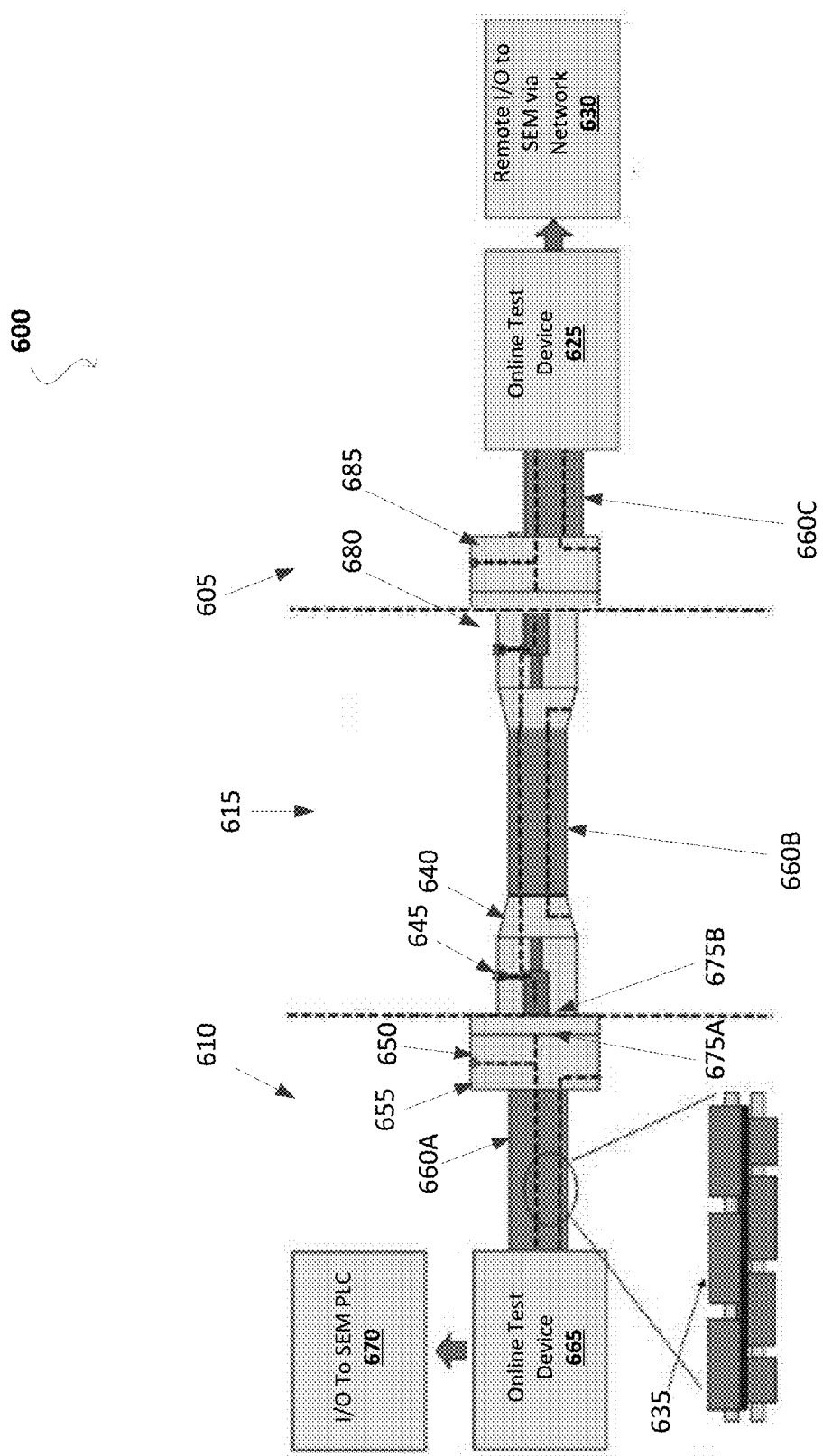
FIG. 6 illustrates a system with a connector of the present disclosure in another connection with a receptacle and/or a module which provide another example system for performing the disclosed embodiments in accordance with an aspect of this disclosure.

FIG. 6 illustrates a system 600 with a connector 600 of the present disclosure in another connection with a receptacle and/or a module 655 which provide another example system for performing the disclosed embodiments in accordance with an aspect of this disclosure. In the alternate aspect of FIG. 6, additional monitoring features allow real time monitoring of the cable integrity while in use in subsea environments. For example, insulation can be selectively monitored on portions of the wiring in the cable to allow a determination of insulation resistance. The access ports 650 and 645 are accessed by measurement probes connected to a measuring or metering device as illustrated in FIGS. 3-5. Corresponding spaces in connector 650 and receptacle or module 655 are accessed by connector inserts including probe ends 675A and 675B. Data collected by measuring or metering device or measurement probes can be transmitted using an appropriate means to a remote location for integrity assessment.

For example, the data may be provided via a portion of the wiring in cable 635 and 660. In another example, the data may be provided via established wireless communication methods. Some of these examples may rely on at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network, and any combination thereof.

FIG. 6 illustrates three sections of the system 600, including a first housing section 605, a second housing section 610, and a subsea section 615. In each of the housing sections 605, 610, data from one or more measuring devices and/or measurement probes accessing fluid in respective connectors 640, 655 and 680, 685 is provided via cable 635 of the connectors 660A, 660B to respective online test devices 625, 665. The online test devices 625, 665 transmit the data to respective remote input-output modules 630, 670, for a subsea electronics module (SEM) via any one of the previously discussed network methods. The subsea section 615 remains submerged without a need for removal of the connectors 645, 680 to place probes and to collect data to determine integrity of the connectors. As such, a corresponding measuring or metering device and/or corresponding measurement probes accessing receptacle or module 655 (and a similar application in connector 680, 685) is provided via cable 635 (and a similar cable section 660C for housing section 605) to an online test device 665, which then transmits the data to a remote input-output module 670 for an SEM programmable logic controller (PLC) 670 via any one of the previously discussed network methods. Similar access, physical structure, and connections as in connectors 640, 655 are provided in connector 680, 685. The data is continuously analyzed for changes in resistance can indicate in ingress of water into the cable or the connection. In the example of FIG. 6, the wiring through cable sections 660A, 660B, and 660C may include a two-wire cable with insulation selectively removed as illustrated in reference number 635. This allows the wiring 635 to access space along the cable 660A or 660B for collecting data in the similar manner as using probe ends 675A or 675B in the connector inserts. In addition, the fluid in the connectors 655, 640, and 680, 685 are maintained at 1 standard atmosphere relative to pressure at sea surface level—where the connections for the connectors are made prior to submerging.

Figure 7:
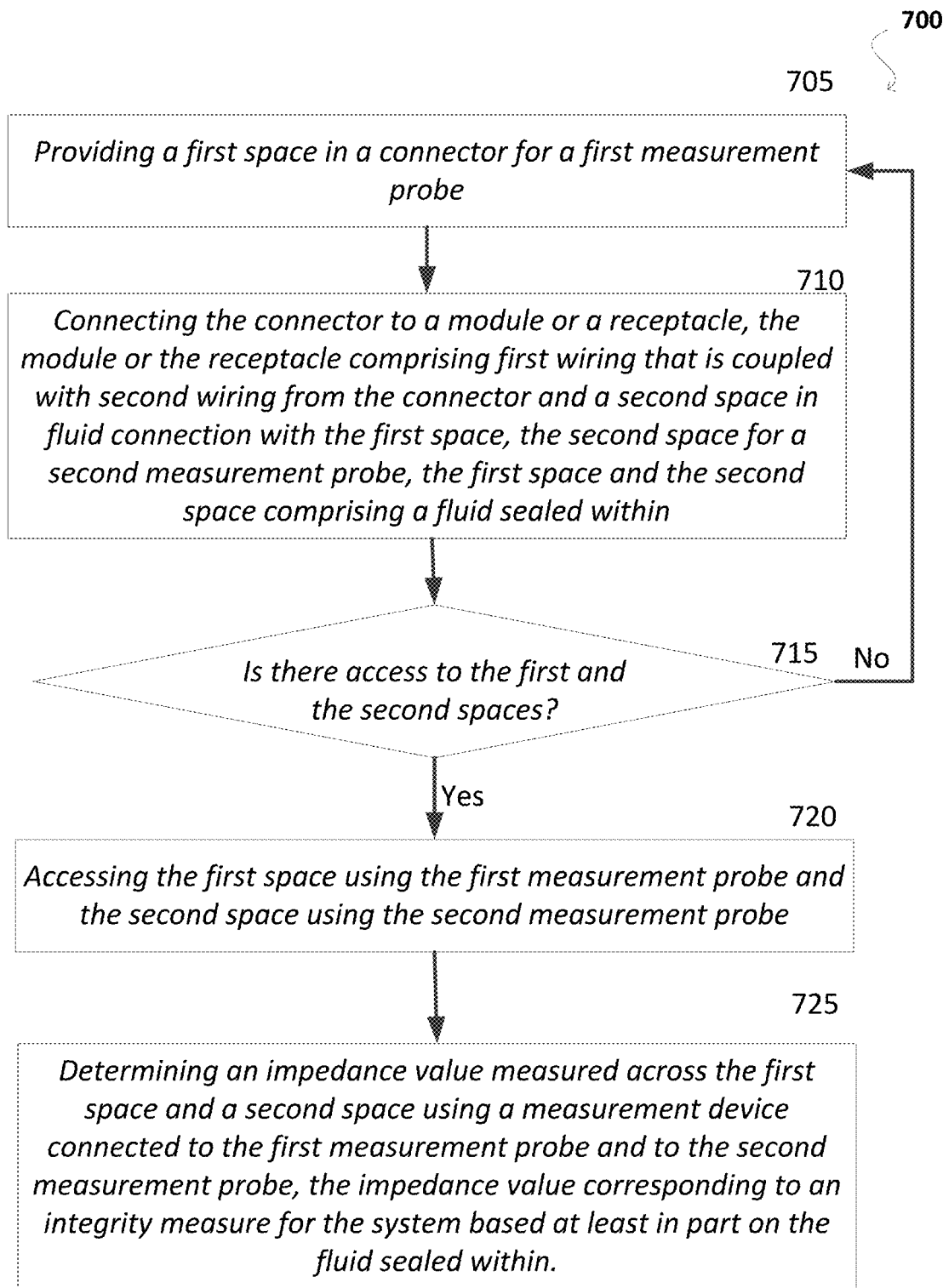
FIG. 7 illustrates an example flow diagram for performing the disclosed embodiments in accordance with an aspect of this disclosure.

FIG. 7 illustrates an example flow diagram 700 of a system for performing the disclosed embodiments in accordance with an aspect of this disclosure. Block 705 provides a first space in a connector for a first measurement probe. The first space includes a first measurement probe. Block 710 connects the connector to a module or a receptacle. The module or the receptacle includes first wiring coupled with second wiring in the connector. Further, the module or the receptacle includes a second space with a second measurement probe. The second space is remotely located from the first space and may overlap the first space. In addition, the second space is in fluid connection with the first space and the first space and the second space include a fluid. Block 715 determines if there is access to the first and the second spaces. When no access is provided, the system continues to function with its operational requirements and the flow diagram 700 resets with block 705. When there is access, block 720 determines an impedance value measured across the first space and a second space using a measurement device connected to the first measurement probe and to the second measurement probe.

The impedance value corresponds to an integrity measure for the connector in connection with the module or the receptacle. Further, as discussed in this disclosure, the resistance value may be extended to determine integrity of the system because the connection between the connector and the module or the receptacle provides such information. Further, the impedance value corresponds to an integrity measure for the system based at least in part on the fluid sealed within. As explained previously, ingress of seawater or loss of the fluid from the first space and/or the second space may change the impedance measure across the first space and the second space. The change of impedance generally measure then indicates that seals or other parts of the connector, or the module or the receptacle have been compromised. Alternately, a break in the connection between the connector and the module or the receptacle, or a break further up from the connection—e.g., the cables, may have occurred. A break away from the connection may leak seawater or the fluid through the cabling.

Example environments discussed herein for implementing aspects in accordance with various embodiments may include web-based environments for remotely providing data collected by the measurement devices and/or the measurement probes. Different environments may be used, as appropriate, to implement various embodiments. The devices in FIG. 6, for example, that are used to interact with various embodiments for data collection and transmission can include any appropriate device operable to send and receive requests, messages, or information over an appropriate network and convey information back to a user of the device. The network to connect these devices can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections, and combinations thereof.

It should be understood from the present disclosure that there can be several application servers, layers, or other elements, processes, or components, which may be chained or otherwise configured, which can interact to perform tasks as discussed and suggested herein. As such the data herein may be stored in a data store for later transmission or buffered for continuous transmission. Such a data store refers to any device or combination of devices capable of storing, accessing, and retrieving data, which may include any combination and number of data servers, databases, data storage devices, and data storage media, in any standard, distributed, or clustered environment. The handling of all requests and responses, as well as the delivery of content between devices and receiving resources, can be handled by intermediate server.

A data store, as used herein, can include several separate data tables, databases, or other data storage mechanisms and media for storing data relating to a particular aspect. The data store is operable, through logic associated therewith, to receive instructions from a server, and obtain, update, or otherwise process data in response thereto. In one example, the data store is available for searching of the collected data. A user might submit a search request for a certain type of the collected data. In this case, the data store might access the user information to verify the identity of the user, and can access the collected data to obtain information for the search request. The information then can be returned to the user, such as in a results listing on a web page that the user is able to view via a browser on a user device. Information for particular collected data can be viewed in a dedicated page or window of the browser.

Each device referenced above, including servers, may include an operating system that provides executable program instructions for the general administration and operation of that server, and may include a non-transitory computer-readable medium storing instructions that, when executed by a processor of the devices or servers, allow the devices or servers to perform its intended functions. Suitable implementations for the operating system and functionality of the servers are readily understood upon reading the present disclosure.

The environment in FIG. 6 may be, in one embodiment, a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are described. Thus, the depictions of various systems and services herein should be taken as being illustrative in nature, and not limiting to the scope of the disclosure.

Various aspects can be implemented as part of at least one service or web service, such as may be part of a service-oriented architecture. Services such as web services can communicate using any appropriate type of messaging, such as by using messages in extensible markup language (XML) format and exchanged using an appropriate protocol such as SOAP (derived from the "Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

In embodiments utilizing a server, the server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C # or C++, or any scripting language, such as Perl, Python®, or Tool Command Language (TCL), as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices may also include a number of software applications, modules, services, or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and other non-transitory computer readable media for containing code, or portions of code, can include any appropriate media known or used in the art, including storage media and communication media, such as but not limited to volatile and non-volatile, removable and non-removable media implemented in any method or technology for storage of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A blowout preventer (BOP) stack comprising:
    at least a cable with a connector that is coupled to a module or a receptacle;
    the connector comprising a first space for a first measurement probe;
    the module or the receptacle comprising a second space that is in fluid communication with the first space, the second space and the first space comprising a fluid sealed within, the second space comprising a second measurement probe; and
    a measurement device connectable to the first measurement probe and the second measurement probe to determine an impedance value across the first space and the second space.

2. The BOP stack according to claim 1, wherein the impedance value corresponds to an integrity measure for the connector.

3. The BOP stack according to claim 1, further comprising:
    a first port providing external access to the first space; and
    a second port providing external access the second space that is located in the module or the receptacle.

4. The BOP stack according to claim 1, further comprising:
    a connector insert receptacle or plug within the connector and in detachable coupling between first wiring in the cable and second wiring from the module or the receptacle;
    a first portion of the first wiring to provide or function as the first measurement probe with access to the first space;
    a second portion of the second wiring to provide or function as the second measurement probe with access the second space;
    one or more data retrieval components connected to the first wiring and the second wiring; and
    one or more remote transmitters to transmit data from the one or more data retrieval components; and
    the measurement device connected to the first measurement probe and the second measure probe, through the one or more transmitters, to determine the resistance value across the first space and a second space.

5. The BOP stack according to claim 1, wherein the fluid is one of: (a) an oil with a specific gravity that is up to 5% or up to 10% different than fresh or salt water's specific gravity at a predetermined temperature; (b) air; or (c) a combination of the oil and the air.

6. The BOP stack according to claim 1, where the connector is a pressure balanced oil-filled (PBOF) connector.

7. A system comprising:
    a connector comprising a first space for a first measurement probe;
    a module or a receptacle connected to the connector, the module or the receptacle comprising first wiring that is coupled with second wiring from the connector and comprising a second space in fluid connection with the first space, the second space for a second measurement probe, the first space and the second space comprising a fluid sealed within; and
    a measurement device connected to the first measurement probe and the second measurement probe to determine an impedance value across the first space and the second space, the impedance value based at least in part on the fluid sealed within.

8. The system according to claim 7, wherein the connector is a pressure balanced oil-filled (PBOF) connector.

9. The system according to claim 7, further comprising:
a first port providing external access to the first space; and
a second port providing external access the second space that is located in the module or the receptacle.

10. The system according to claim 9, wherein the first port and the second port are sealable openings to the first space and the second space, respectively, within the connector.

11. The system according to claim 7, further comprising:
a connector insert receptacle or plug within the connector and in detachable coupling between the first wiring and the second wiring;
a first portion of the first wiring to provide or function as the first measurement probe with access to the first space;
a second portion of the second wiring to provide or function as the second measurement probe with access the second space;
one or more data retrieval components connected to the first wiring and the second wiring; and
one or more remote transmitters to transmit data from the one or more data retrieval components; and
the measurement device connected to the first measurement probe and the second measure probe, through the one or more transmitters, to determine the resistance value across the first space and a second space.

12. The system according to claim 7, wherein the fluid is one of: (a) an oil with a specific gravity that is up to 5% or up to 10% different than fresh or salt water's specific gravity at a predetermined temperature; (b) air; or (c) a combination of the oil and the air.

13. The system according to claim 7, wherein the module or the receptacle is a subsea electronics module (SEM).

14. A method comprising:
providing a first space in a connector for a first measurement probe;
connecting the connector to a module or a receptacle, the module or the receptacle comprising first wiring that is coupled with second wiring from the connector and a second space in fluid connection with the first space, the second space for a second measurement probe, the first space and the second space comprising a fluid sealed within; and
determining an impedance value measured across the first space and a second space using a measurement device connected to the first measurement probe and to the second measurement probe, the impedance value based at least in part on the fluid sealed within.

15. The method according to claim 14, wherein the connector is a pressure balanced oil-filled (PBOF) connector.

16. The method according to claim 14, further comprising:
providing external access to the first space using a first port; and
providing external access the second space that is located in the module or the receptacle using a second port.

17. The method according to claim 16, further comprising:
providing sealable opening to the first space and the second space via the first port and the second port.

18. The method according to claim 14, further comprising:
providing the coupling between the first wiring and the second wiring and including a connector insert receptacle or plug in a detachable coupling within the connector;
providing a first portion of the first wiring with access to the first space as the first measurement probe;
providing a second portion of the second wiring with access to the second space as the second measurement probe;
providing one or more data retrieval components connected to the first wiring and the second wiring for retrieving data from the first portion and the second portion of the first wiring and the second wiring, respectively; and
transmitting, using one or more remote transmitters, the retrieved data from the one or more data retrieval components to the measurement device; and
determining, using the measurement device, the impedance value across the first space and the second space.

19. The method according to claim 14, wherein the fluid is one of: (a) an oil with a specific gravity that is up to 5% or up to 10% different than fresh or salt water's specific gravity at a predetermined temperature; (b) air; or (c) a combination of the oil and the air.

20. The method according to claim 14, wherein the module or the receptacle is a subsea electronics module (SEM).

* * * * *